(12) United States Patent
Fang et al.

(10) Patent No.: US 9,256,138 B2
(45) Date of Patent: Feb. 9, 2016

(54) METHOD FOR MEASURING DISTORTION OF PROJECTION OBJECTIVE

(75) Inventors: Li Fang, Shanghai (CN); Gang Sun, Shanghai (CN); Jinhua Min, Shanghai (CN); Jun Zhang, Shanghai (CN)

(73) Assignee: SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 324 days.

(21) Appl. No.: 14/002,917

(22) PCT Filed: Mar. 21, 2012

(86) PCT No.: PCT/CN2012/072693
§ 371 (c)(1), (2), (4) Date: Sep. 3, 2013

(87) PCT Pub. No.: WO2012/126364
PCT Pub. Date: Sep. 27, 2012

(65) Prior Publication Data
US 2013/0335718 A1  Dec. 19, 2013

(30) Foreign Application Priority Data
Mar. 21, 2011 (CN) .......................... 2011 1 0068060

(51) Int. Cl.
*G03F 7/20* (2006.01)
*G03F 1/44* (2012.01)

(52) U.S. Cl.
CPC *G03F 7/706* (2013.01); *G03F 1/44* (2013.01); *G03F 7/70633* (2013.01); *G03F 7/70725* (2013.01)

(58) Field of Classification Search
CPC ............ G03F 7/70216; G03F 7/70258; G03F 7/70425; G03F 7/70433; G03F 7/70483; G03F 7/705; G03F 7/70491; G03F 7/70508; G03F 7/706; G03F 7/70616; G03F 7/70633; G03F 7/70683; G03F 7/70725; G03F 1/44
See application file for complete search history.

(56) References Cited

U.S. PATENT DOCUMENTS

| | | | | |
|---|---|---|---|---|
| 5,473,435 A | * | 12/1995 | Masuyuki | ............ G01B 11/306 355/53 |
| 6,061,119 A | | 5/2000 | Ota | |
| 2005/0117154 A1 | * | 6/2005 | McArthur | .......... G02B 27/0025 356/401 |

FOREIGN PATENT DOCUMENTS

| | | |
|---|---|---|
| CN | 1770419 A | 5/2006 |
| CN | 101040367 A | 9/2007 |

(Continued)

*Primary Examiner* — Peter B Kim
*Assistant Examiner* — Michelle Iacoletti
(74) *Attorney, Agent, or Firm* — Muncy, Geissler, Olds & Lowe, P.C.

(57) ABSTRACT

A method for measuring distortion of a projection objective, which includes: obtaining a plurality of first positional deviations between two groups of patterns formed respectively after two exposures performed in a same exposure field during a stepping and exposing process of the reticle stage (S21); obtaining a plurality of second positional deviations between two groups of patterns formed respectively after another two exposures performed in a same exposure field during a stepping and exposing process of the workpiece stage (S22); subtracting motional errors of the reticle stage and/or workpiece stage from each of the plurality of first and second positional deviations to obtain corresponding first and second corrected deviations (S43, S44); calculating differences each between a pair of corrected deviations (S45); and calculating the distortion of the projection objective by a fitting process (S46).

20 Claims, 3 Drawing Sheets

(56) References Cited

FOREIGN PATENT DOCUMENTS

| CN | 101387833 A | 3/2009 |
| CN | 101435998 A | 5/2009 |
| JP | 3397654 B2 | 2/2003 |

* cited by examiner

METHOD FOR MEASURING DISTORTION OF PROJECTION OBJECTIVE

TECHNICAL FIELD

The present invention relates in general to the manufacturing of integrated circuits, and more particularly, to a method for measuring distortion of a projection objective used in a lithography machine:

BACKGROUND

Lithography, also known as photolithography, has been widely used in the manufacturing of integrated circuits. This technology employs a lithographic system to expose and transfer a reticle pattern onto a photoresist. As the lithographic system ultimately determines the critical dimension of an integrated circuit being manufactured, its precision is of great significance to a lithography process. During exposure, a silicon wafer coated with photoresist is sucked on a wafer chuck, and its top surface shall be set at an optimum image plane height to achieve the best imaging result. A lithography machine is a device used in the manufacturing of integrated circuits. It can be used in, but not limited to, lithography apparatuses for integrated circuits, liquid crystal display (LCD) panels, photomasks, micro-electro-mechanical systems (MEMSs)/micro-opto-mechanical systems (MOMSs), advanced packaging, printed circuit boards, and also in PCB processing apparatuses, etc.

The following two methods are majorly adopted for measuring distortion of a projection objective during the operation of a lithography machine in the prior art.

The first method is to measure the image quality of a projection objective by using reticle alignment sensors of a lithography machine. Such method is disclosed in, for example, U.S. Pat. No. 7,333,175 and WO94/01808. In this method, as an optical path passes through the objective during the alignment of the reticle, distortion of the objective can be reflected by the alignment results. However, drawbacks of this method include: firstly, both interferometer and reticle alignment system of the lithography machine are required to have a high performance as the precision of the objective distortion measurement is highly dependent on the repeatability of the measurement of reticle alignment marks; secondly, the method is relied on specific reticle alignment approaches. For example, it may not provide satisfactory measurement results when the lithography machine adopts a charge coupled device (CCD) alignment approach or the like. Further, the manufacturing and processing of an alignment mark grating is highly complicated, and hence will lead to a high cost in the fabrication of a reticle having a high-precision alignment mark array. Moreover, high-order distortion itself will affect the reticle alignment sensors during the detection of alignment positions, and therefore limits the applicability of this method. As a result, the method is only suited for measuring low-order distortions but not high-order distortions of an objective.

The second method is to measure the distortions of a projection objective by using image quality sensors. Such method is disclosed in, for example, U.S. Pat. Nos. 0,136,070, 0,144,043, 0,264,827 and 6,650,399. Such sensors, with high precision, are specially designed for the measurement of objective image quality, including high-order distortions and performance of the objective. However, these sensors typically have a delicate and complex structure, and in particular, optical elements of these sensors require extremely expensive manufacturing technology. Moreover, the sensors must cooperate with a high-performance lithography machine to play the best performance in objective distortion measurement. For these reasons, except some most high-end lithography machines, currently used common ones cannot afford to be equipped with such sensors, and hence the method has a low adaptability for lithography machines.

Thus, there is a need for a highly adaptable high-precision method for measuring projection objective distortion of lithography machines.

SUMMARY OF THE INVENTION

An objective of the present invention is to provide a method for measuring distortion of a projection objective, which can achieve a high measurement precision and a high adaptability.

To achieve the above objective, the present invention provides a method for measuring distortion of a projection objective, including:

disposing a reticle on a reticle stage and disposing a substrate on a workpiece stage, the reticle having a plurality of marks formed thereon;

performing a stepping and exposing process of the reticle stage, including: moving the substrate into an exposure field of the projection objective; performing a first exposure process to form on the substrate a first pattern of the plurality of marks corresponding to the current exposure field; keeping the workpiece stage unmoved and stepping the reticle stage by a first distance, and then performing a second exposure process to form on the substrate a second pattern of the plurality of marks corresponding to the current exposure field; obtaining a first positional deviation between the first pattern and the second pattern;

performing a stepping and exposing process of the workpiece stage, including: moving the substrate into an exposure field of the projection objective; performing a first exposure process to form on the substrate a third pattern of the plurality of marks corresponding to the current exposure field; keeping the reticle stage unmoved and stepping the workpiece stage by a second distance, and then performing a second exposure process to form on the substrate a fourth pattern of the plurality of marks corresponding to the current exposure field; obtaining a second positional deviation between the third pattern and the fourth pattern;

subtracting a motional error of the reticle stage and/or the workpiece stage from the first positional deviation to obtain a first corrected deviation, and subtracting a motional error of the reticle stage and/or the workpiece stage from the second positional deviation to obtain a second corrected deviation; and calculating a difference between the second corrected deviation and the first corrected deviation, and calculating a distortion of the projection objective based on the difference.

Further, the substrate is disposed on the workpiece stage at a position aligned with a center of the projection objective.

Further, the stepping and exposing process of the reticle stage is performed prior to the stepping and exposing process of the workpiece stage, or the stepping and exposing process of the workpiece stage is performed prior to the stepping and exposing process of the reticle stage.

Further, performing the stepping and exposing process of the reticle stage further includes optimizing an exposure path prior to moving the substrate into an exposure field of the projection objective; and performing the stepping and exposing process of the workpiece stage further includes optimizing an exposure path prior to moving the substrate into an exposure field of the projection objective.

Further, each of the plurality of marks includes two portions arranged in parallel to each other.

Further, each of the plurality of marks is an overlay mark.

Further, the reticle stage is stepped by a first distance in a direction along a line connecting centers of the two portions of any of the plurality of marks, and wherein the workpiece stage is stepped by a second distance in a direction along a line connecting centers of the two portions of any of the plurality of marks.

Further, the first distance is D*Nom_mag, where D is a distance between the centers of the two portions of each of the plurality of marks, and Nom_mag is a nominal magnification of the projection objective.

Further, the second distance is D, where D is a distance between the centers of the two portions of each of the plurality of marks.

Further, the motional error of the reticle stage and/or the workpiece stage includes a translational error and a rotational error of the reticle stage and/or the workpiece stage.

To achieve the above objective, the present invention further provides a method for measuring distortion of a projection objective, including:

disposing a reticle on a reticle stage and disposing a substrate on a workpiece stage, the reticle having a plurality of marks formed thereon;

performing a stepping and exposing process of the reticle stage, including:

a1) moving the substrate into an exposure field of the projection objective;

a2) performing a first exposure process to form on the substrate a first pattern of the plurality of marks corresponding to the current exposure field;

a3) keeping the workpiece stage unmoved and stepping the reticle stage by a first distance, and then performing a second exposure process to form on the substrate a second pattern of the plurality of marks corresponding to the current exposure field;

a4) obtaining a first positional deviation between the first pattern and the second pattern;

a5) moving the substrate into a next exposure field of the projection objective;

a6) repeating steps a2 to a5 to obtain a plurality of first positional deviations corresponding to a plurality of exposure fields;

performing a stepping and exposing process of the workpiece stage, including:

b1) moving the substrate into an exposure field of the projection objective;

b2) performing a first exposure process to form on the substrate a third pattern of the plurality of marks corresponding to the current exposure field;

b3) keeping the reticle stage unmoved and stepping the workpiece stage by a second distance, and then performing a second exposure process to form on the substrate a fourth pattern of the plurality of marks corresponding to the current exposure field;

b4) obtaining a second positional deviation between the third pattern and the fourth pattern;

b5) moving the substrate into a next exposure field of the projection objective;

b6) repeating steps b2 to b5 to obtain a plurality of second positional deviations corresponding to a plurality of exposure fields;

subtracting a motional error of the reticle stage and/or the workpiece stage from each of the plurality of first positional deviations to obtain a plurality of first corrected deviations, and subtracting a motional error of the reticle stage and/or the workpiece stage from each of the plurality of second positional deviations to obtain a plurality of second corrected deviations; and calculating differences each between one of the plurality of first corrected deviations and a corresponding one of the plurality of second corrected deviations of a same exposure field, and calculating a distortion of the projection objective based on the differences.

Compared to the prior art, the methods of the present invention are advantageous in the following aspects:

Firstly, the methods of the present invention have low dependency on the type of the reticle marks. The methods may employ common overlay marks used in combination with an overlay reticle or may employ some other specially designed marks. Secondly, as the process of objective distortion measurement is performed in a same way as normal operation of the lithography machine, it can well represent distortion in image quality induced during the exposure process of the lithography machine, and thereby may enhance objectivity and accuracy of the measurement results. Thirdly, the methods are implemented by directly performing exposures, which enables the measurement accuracy to be directly determined by the image quality factors of the projection objective, thus imposing few requirements on external devices or configurations of the lithography machine and giving the methods suitability for any high-end or low-end lithography machines. Fourthly, the methods of the present invention have no limitations to alignment approaches of the lithography machine, thereby results in the reduction of manufacturing cost of the lithography machine and an increase of adaptability of the methods.

BRIEF DESCRIPTION OF THE DRAWINGS

Advantages and principles of the present invention can be further understood by means of reference to the following detailed description and the accompanying drawings.

DETAILED DESCRIPTION OF THE INVENTION

A number of specific embodiments are described in detail below in conjunction with the accompanying drawings.

The present invention is based on a core concept of measuring projection objective distortion by exposures, and more specifically, is based on the main principle as follows: by performing a stepping and exposing process of the workpiece stage and performing a stepping and exposing process of the reticle stage respectively, exposed patterns corresponding to these two processes can be obtained on the substrate, and positional deviations of the exposed patterns corresponding to each of these two processes can be calculated. As both the reticle mark and the exposed patterns have a certain size, when the workpiece stage is stepped while keeping the reticle stage unmoved, the exposure positions will correspond to different positions in the projection objective and hence a distortion of the projection objective will be contained in the positional deviation of the corresponding patterns; and conversely, when the reticle stage is moved while keeping the workpiece stage unmoved, the exposure positions will be an identical position in the projection objective and hence no distortion of the projection objective will be contained in the positional deviation of the corresponding patterns. Thus, distortion of the projection objective can be derived from statistical analysis of the positional deviations of the patterns generated by these two different types of stepping and exposing processes.

Figure 1:
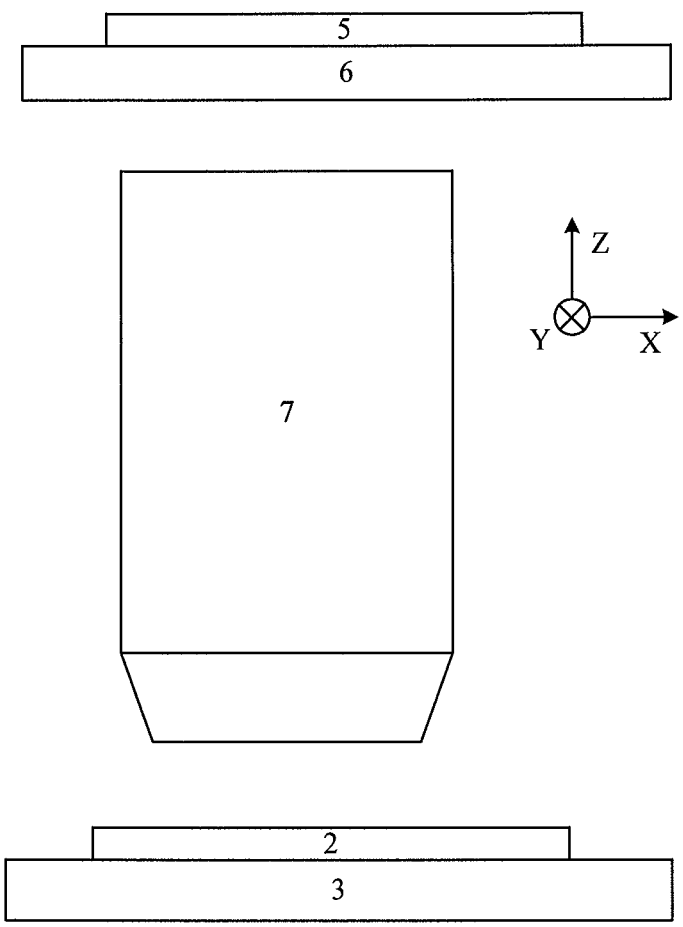
FIG. 1 is a schematic diagram illustrating main components of a lithography machine employed in a method for measuring projection objective distortion in accordance with embodiments of the present invention.

Referring to FIG. 1, which is a schematic diagram illustrating main components of a lithography machine employed in a projection objective distortion measurement method embodying the present invention. These main components include: a reticle 5 clamped or fixed on a reticle stage 6, the reticle stage 6 carrying the reticle 5 to move in multiple degrees of freedom, the reticle 5 having a plurality of marks evenly distributed thereon in an exposure area; a substrate 2 (e.g., silicon wafer, glass substrate, sapphire substrate, etc.), sucked on a workpiece stage 3 and able to move together with the workpiece stage 3; and a projection objective 7 for imaging the plurality of marks of the reticle 5 onto the substrate 2. By moving the workpiece stage 3 and/or the reticle stage 6, the plurality of marks can be exposed onto the substrate at any position. Moreover, with these main components, objective distortion can be measured. As every existing lithography machine includes these components, the method of the present invention has high adaptability and does not require any extra component which is special and expensive.

Figure 2:
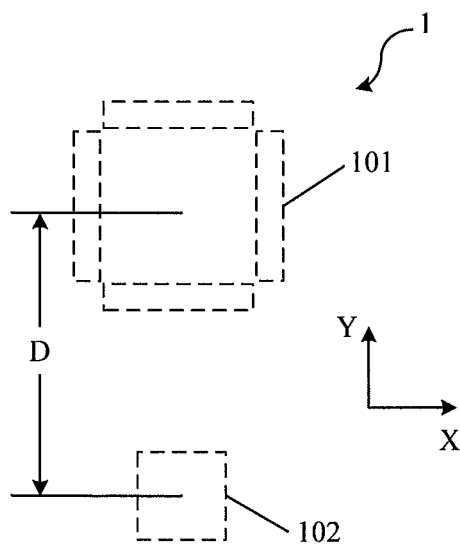
FIG. 2 is a schematic illustration of a mark used in a method for measuring projection objective distortion in accordance with a preferred embodiment of the present invention.

FIG. 2 is a schematic illustration of one of the plurality of marks used in a projection objective distortion measurement method in a preferred embodiment of the present invention. The mark 1 is a commonly used overlay mark comprising two portions, wherein a center of the first portion 101 is a distance D from a center of the second portion 102. The mark 1 may either be used in combination with an overlay reticle or be designed as some other special mark. The method of the present invention has no specific requirements on the mark 1, and thus has little dependency on the mark 1. In this preferred embodiment, the first portion 101 is consisted of four stripes having identical shape and size. In addition, the four stripes are joined together at their ends and thereby enclose a large square area. The second portion 102 is arranged in parallel to the first portion 101 and has a small square shape which can fit inside the large square area enclosed by the four stripes of the first portion 101. Those skilled in the art shall appreciate that the present invention is not limited to the mark 1 shown in FIG. 2. The present invention may employ any other commonly used overlay marks or any special marks that enable overlay error measurement.

A method for measuring distortion of a projection objective in accordance with an embodiment of the present invention will be specified and described below with reference to FIG. 3, FIGS. 4A to 4C, and FIG. 5.

Figure 3:
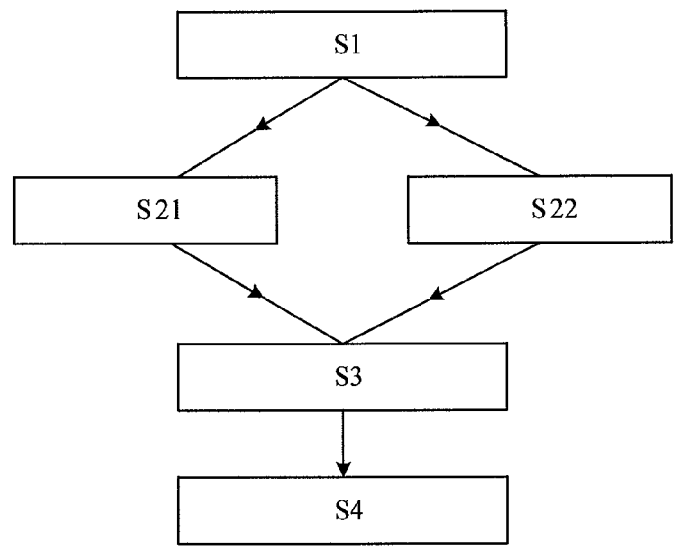
FIG. 3 is a flow chart depicting a method for measuring projection objective distortion in accordance with embodiments of the present invention.

Referring to FIG. 3, which shows a flow chart of the method for measuring distortion of a projection objective of the present invention, the method substantially includes four stages, wherein the first stage S1 is a preparation stage; the second stage S2 is an exposure stage; the third stage S3 is a wafer processing stage; and the fourth stage S4 is an objective distortion calculation stage. The second stage S2 further includes two sub-stages, namely a stepping and exposing process of the reticle stage S21 and a stepping and exposing process of the workpiece stage S22. The two sub-stages S21 and S22 may be performed one after another in either sequential order.

Specifically, in the preparation stage S1, the reticle 5 having a plurality of marks 1 formed thereon is placed on the reticle stage 6 and has a fixed relative position with respect to the reticle stage 6. The plurality of marks 1 are uniformly and evenly distributed in an exposure area of the reticle 5. Further, the substrate 2, which is a silicon wafer 2 in this embodiment, is placed on the workpiece stage 3. Throughout the measurement process of the method in this embodiment, at least two pieces of silicon wafers 2 are needed, one of which is a reference wafer having an alignment mark formed thereon for reticle alignment and wafer alignment. Moreover, in the preparation stage S1, in order to achieve the best measurement accuracy, the silicon wafer 2 is preferably placed at a position aligned with a center of the projection objective 7, such that the area to be exposed substantially coincides with an area of the projection objective 7 to be measured. As indicated above, the purpose of the preparation stage S1 is for setting the components of the lithography machine in place.

Figure 5:
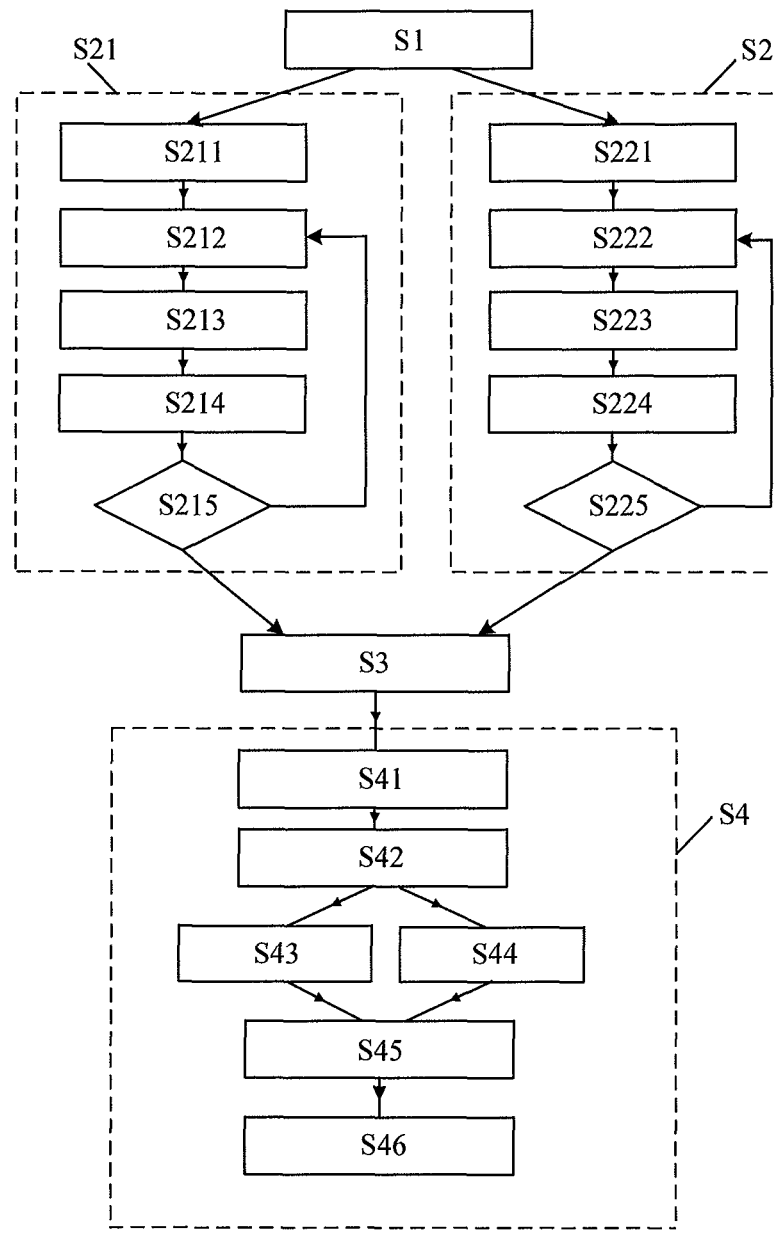
FIG. 5 is a detailed flow chart depicting a method for measuring projection objective distortion in accordance with a preferred embodiment of the present invention.

The second stage S2 is an exposure stage which further includes two sub-stages, namely a stepping and exposing process of the reticle stage S21 and a stepping and exposing process of the workpiece stage S22. FIG. 5 depicts details of the exposure stage S2.

In this embodiment, the stepping and exposing process of the reticle stage S21 includes the following steps:

In step S211, an exposure path is optimized.

In step S212, an exposure system is adjusted and controlled to make sure that the lithography machine meets the exposure requirements.

Figures 4A, 4B, 4C:
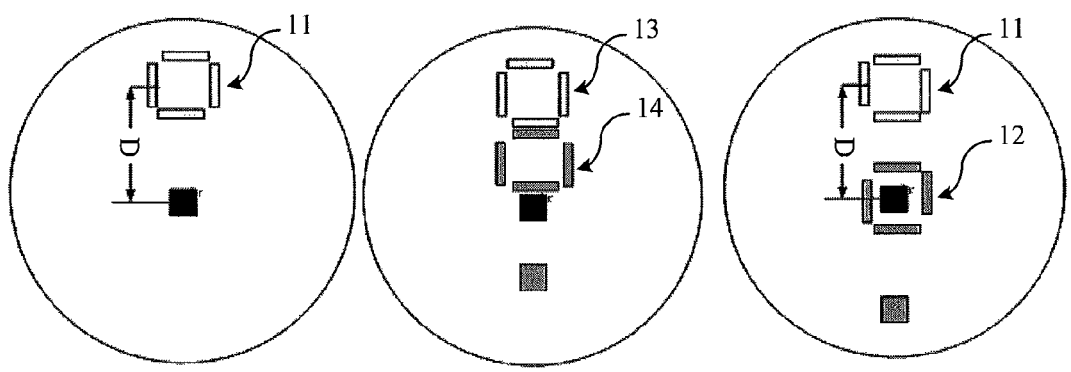
FIGS. 4A to 4C are schematic illustrations of patterns formed on silicon wafers after the mark of FIG. 2 is exposed.

In step S213, a first exposure process is performed on a first silicon wafer 2. The first exposure process mainly includes: moving the workpiece stage 3 to position the silicon wafer 2 sucked thereon in a first exposure field; and exposing the plurality of reticle marks on the first silicon wafer 2. After the first exposure, a plurality of first patterns 11 corresponding to the plurality of reticle marks are formed on the silicon wafer. FIG. 4A shows an example of one of the plurality of first patterns 11. A positional coordinate ($Wx11$, $Wy11$) of each first pattern 11 in the coordinate system of the silicon wafer 2 and a positional coordinate ($Fx11$, $Fy11$) of each first pattern 11 in the coordinate system of the first exposure field may be easily measured using any appropriate existing method in a subsequent stage. The coordinate ($Wx11$, $Wy11$) may be defined as a coordinate of a center of the first portion 101 of the first pattern 11, or a coordinate of a center of the second portion 102 of the first pattern 11 with respect to a center of the silicon wafer 2. Similarly, the coordinate ($Fx11$, $Fy11$) may be defined as a coordinate of a center of the entire first pattern 11, or a coordinate of the center of any one of the first and second portions 101, 102 of the first pattern 11 with respect to a center of the current exposure field (i.e., the first exposure field). Herein, '11' in ($Wx11$, $Wy11$) and ($Fx11$, $Fy11$) indicates that the coordinates are corresponding to the '1'st exposure field and the '1'st exposure.

In step S214, a second exposure process is performed on the first silicon wafer 2. During the second exposure process, the workpiece stage 3 is fixed in its position and the reticle stage 6 is controlled to step a distance L in a −Y direction (or in +Y, +X, or −X directions according to the structure of the mark 1 or the exposure path), where $L = D \ast Nom\_mag$; $Nom\_mag$ is a nominal magnification of the objective 7. Then perform a second exposure in the first exposure field, and after which a plurality of second patterns 12 corresponding to the plurality of reticle marks 1 are formed on the silicon wafer 2.

One of the plurality of second patterns 12 is exemplarily illustrated as the grey shadings in FIG. 4C. Similarly, a positional coordinate (Wx12, Wy12) of each second pattern 12 in the coordinate system of the silicon wafer 2, a positional coordinate (Fx12, Fy12) of each second pattern 12 in the coordinate system of the first exposure field and a positional deviation (Ex1, Ey1) between each pair of first and second patterns 11 and 12 may be easily measured using an appropriate existing method in a subsequent stage. Herein, similarly, '12' in (Wx12, Wy12) and (Fx12, Fy12) indicates that the coordinates are corresponding to the '1'st exposure field and the '2'nd exposure. The positional deviation (Ex1, Ey1) is defined as a distance between a center of the second portion 102 of one of the first patterns 11 and a center of a first portion 101 of a corresponding one of the second patterns 12 obtained in the first exposure field, namely, an overlay error between each pair of first and second patterns 11 and 12 formed by the respective two exposures in the first exposure field. The overlay errors may be read using an existing overlay tool or any other relevant device, detailed description of which is omitted herein.

As in the above steps S213 and S214, namely in the stepping and exposing process of the reticle stage, only the reticle stage 6 is moved while the workpiece stage 3 is kept unmoved, the exposure positions on the silicon wafer of the respective two exposures correspond to an identical position in the projection objective 7. Therefore, the positional deviation (Ex1, Ey1) between any pair of the two exposure patterns 11 and 12 of the first exposure field shall not contain distortion of the projection objective 7. What shall be mainly contained in the positional deviation (Ex1, Ey1) include translational and rotational errors introduced by the movement of the reticle stage 6 and/or the workpiece stage 3, and manufacturing tolerance error of the reticle 5.

In order to mitigate the influence of the randomly distributed motional errors of the reticle stage and/or the workpiece stage and improve the accuracy of the objective distortion calculated in a subsequent fitting process, it is recommended to repeat the above processes so as to obtain a plurality of sets of data. Thus, step S215 is performed to move the workpiece stage 3 into a next exposure field (or a second exposure field) and carry out two exposures in the second exposure field in a similar manner as described in steps S213 and S214. Specifically, step S215 includes: moving the workpiece stage 3 to position the silicon wafer 2 sucked thereon in the second exposure field; performing a first exposure to form a plurality of patterns on the silicon wafer 2 and the positional coordinates (Wx21, Wy21) and (Fx21, Fy21) of each pattern may be derived in a subsequent stage; next, fixing the workpiece stage 3 in its position and controlling the reticle stage 6 to step a distance L in the −Y direction; performing a second exposure to form another plurality of patterns of the reticle marks on the silicon wafer 2 and the positional coordinates (Wx22, Wy22) and (Fx22, Fy22) of each of the another plurality of patterns as well as a positional deviation (Ex2, Ey2) between each pair of the two patterns obtained by the respective two exposures in the second exposure field may be derived in a subsequent stage. Similarly, the positional deviations (Ex2, Ey2) shall not include distortion of the projection objective. After that, the workpiece stage 3 may be moved into a next exposure field and carry out two further exposures. The above steps may be repeated for a desired number of times so as to obtain n sets of data, which may be indicated as (Wxi1, Wyi1), (Fxi1, Fyi1), (Wxi2, Wyi2), (Fxi2, Fyi2) and (Exi, Eyi), where i=3, 4, . . . , n; n is a natural number.

The stepping and exposing process of the workpiece stage S22 may be carried out in a similar way to the stepping and exposing process of the reticle stage S21, and it mainly differs from sub-stage S21 in moving the workpiece stage 3 while keeping the reticle stage 6 unmoved. Sub-stage S22 may include the steps described in detail below.

First in step S221, an exposure path is optimized.

Then in step S222, an exposure system is adjusted and controlled to make sure that the lithography machine meets the exposure requirements. As steps S221 and S222 are similar to steps S211 and S212, reference can be made here to the above description of steps S211 and S212.

In step S223, a first exposure process is performed on a second silicon wafer 2. The first exposure process mainly includes: moving the workpiece stage 3 to position the silicon wafer 2 thereon in a first exposure field; and exposing the reticle marks on the second silicon wafer 2. After the first exposure, a plurality of patterns 13 corresponding to the plurality of reticle marks are formed on the silicon wafer. FIG. 4B shows an example of one of the plurality of patterns 13. A positional coordinate (W'x11, W'y11) of each pattern 13 in the coordinate system of the second silicon wafer 2 and a positional coordinate (F'x11, F'y11) of each pattern 13 in the coordinate system of the first exposure field may be easily measured using an appropriate existing method in a subsequent stage. The coordinate (W'x11, W'y11) may be defined as a coordinate of a center of the first portion 101 of the pattern 13, or a coordinate of a center of the second portion 102 of the pattern 13 with respect to a center of the second silicon wafer 2. Similarly, the coordinate (F'x11, F'y11) may be defined as a coordinate of a center of the entire pattern 13, or a coordinate of the center of any one of the first and second portions 101, 102 of the pattern 13 with respect to a center of the current exposure field (i.e., the first exposure field).

In step S224, a second exposure process is performed on the second silicon wafer 2. During the second exposure process, the reticle stage 6 is fixed in its position and the workpiece stage 3 is controlled to step a distance D in the +Y direction (or in −Y, +X, or −X directions according to the structure of the mark or the exposure path). The second exposure is also performed in the first exposure field, and after which a plurality of patterns 14 corresponding to the plurality of reticle marks are formed on the second silicon wafer 2. One of the plurality of patterns 14 is exemplarily illustrated as the grey shadings in FIG. 4B. Similarly, a positional coordinate (W'x12, W'y12) of each pattern 14 in the coordinate system of the second silicon wafer 2, a positional coordinate (F'x12, F'y12) of each pattern 14 in the coordinate system of the first exposure field and a positional deviation (E'x1, E'y1) between each pair of patterns 13 and 14 may be easily measured using an appropriate existing method in a subsequent stage.

As in the above steps S223 and S224, namely in the stepping and exposing process of the workpiece stage, only the workpiece stage 3 is moved while the reticle stage 6 is kept unmoved, the exposure positions on the silicon wafer of the respective two exposures correspond to different positions in the projection objective 7. Therefore, the positional deviations (E'x1, E'y1) between the respective pairs of two exposure patterns 13 and 14 of the first exposure field shall contain distortion of the projection objective 7 in addition to translational and rotational errors introduced by the movement of the reticle stage 6 and/or the workpiece stage 3 as well as manufacturing tolerance error of the reticle 5. As a result, although the workpiece stage 3 is stepped by distance D, an actual distance (see FIG. 4B) between each pair of two patterns 13 and 14 formed on the second silicon wafer 2 after the two exposures has a great difference with the distance D.

Next, in step S225, the workpiece stage 3 is moved into a next exposure field (or a second exposure field), and further two exposures are performed in the second exposure field in a similar manner as described in steps S223 and S224. Specifically, step S225 includes: moving the workpiece stage 3 to position the second silicon wafer 2 thereon in the second exposure field; performing a first exposure to form a plurality of patterns of the reticle marks on the second silicon wafer 2 and the positional coordinates (W'x21, W'y21) and (F'x21, F'y21) of each pattern may be derived in a subsequent stage; then, fixing the reticle stage 6 in its position and controlling the workpiece stage 3 to step a distance D in the +Y direction; performing a second exposure to form another plurality of patterns of the reticle marks on the second silicon wafer 2 and the positional coordinates (W'x22, W'y22) and (F'x22, F'y22) of each of the another plurality of patterns as well as a positional deviation (E'x2, E'y2) between each pair of the two patterns obtained by the respective two exposures in the second exposure field may be derived in a subsequent stage. Similarly, the positional deviations (E'x2, E'y2) shall include distortion of the projection objective. After that, the workpiece stage 3 may be moved into a next exposure field and carry out two further exposures. The above steps may be repeated for a desired number of times to obtain n sets of data, which may be indicated as (W'xi1, W'yi1), (F'xi1, F'yi1), (W'xi2, W'yi2), (F'xi2, F'yi2) and (E'xi, E'yi), where i=3, 4, . . . , n; n is a natural number.

The third stage S3 is a wafer processing stage, which mainly includes the developing and curing of the exposed patterns. All the above-mentioned positional data (Wxi1, Wyi1), (Wxi2, Wyi2), (W'xi1, W'yi1) and (W'xi2, W'yi2), i=1, 2, . . . , n (hereinafter collectively referred to as (Wx, Wy)), positional data (Fxi1, Fyi1), (Fxi2, Fyi2), (F'xi1, F'yi1) and (F'xi2, F'yi2), i=1, 2, . . . , n (hereinafter collectively referred to as (Fx, Fy)), and deviation data (Exi, Eyi) and (E'xi, E'yi), i=1, 2, . . . , n (hereinafter collectively referred to as (Ex, Ey)) are read and measured after the wafer processing stage S3. As the reading and measurement of the positional or deviation data are subject to the wafer processing technology which has been well described and demonstrated in the relevant existing literatures, further description on it is omitted herein.

The fourth stage S4 is an objective distortion calculation stage. In this stage, deviations generated in the exposure processes are analyzed and the objective distortion is calculated based on the analysis results. FIG. 5 shows an embodiment of the fourth stage, which may include steps discussed below.

First, in step S41, for each of the stepping and exposing process of the reticle stage S21 and the stepping and exposing process of the workpiece stage S22, obtain a plurality of sets of positional deviations (Ex, Ey) corresponding to a plurality of exposure fields, wherein each set of positional deviations (Ex, Ey) is obtained from a plurality of pairs of patterns generated by the corresponding two exposures of the same exposure field. Moreover, coordinates (Wx, Wy) and (Fx, Fy) of each exposed pattern, namely each of the patterns formed on the silicon wafers, may be measured concurrently with the measurement of the deviations (Ex, Ey). As definitions and measurement methods of the positional deviations (Ex, Ey) and the positional coordinates (Wx, Wy) and (Fx, Fy) have been described supra, description of them are omitted herein for simplicity.

Next, in step S42, fitting the translational errors (Tx, Ty) and rotational errors (Rx, Ry) of the reticle stage 6 and/or the workpiece stage 3 generated in the stepping and exposing process of the reticle stage S21 and the stepping and exposing process of the workpiece stage S22, respectively so as to subtract these errors (Tx, Ty) and (Rx, Ry) from the positional deviations (Ex, Ey). Those skilled in the art should appreciate that during sub-stages S21 and S22, as the reticle stage 6 and the workpiece stage 3 are both moved in a stepping manner and due to the positioning inaccuracy, the movement of the reticle stage 6 and the workpiece stage 3 may cause translational and rotational errors in the exposures of the marks 1 onto the silicon wafer 2. These translational and rotational errors are included in the positional deviations (Ex, Ey) of the patterns, being mixed with objective distortion, and therefore need to be subtracted. One way to subtract the translational and rotational errors may be implemented as follows: for each exposure field, a residual (dx, dy) for each pair of patterns may be fitted, e.g. through least square method, by using the following equation:

$Ex = Tx - Rx \cdot Fy + dx$ $Ey = Ty + Ry \cdot Fx + dy$ $Fx \in [-Xslit/2, Xslit/2], Fy \in [-Yslit/2, Yslit/2]$ (Equation 1)

where, Xslit and Yslit are sizes of a field of view (FOV) in the X and Y directions, respectively.

By using the above Equation 1, the inter-field errors caused by the translation and rotation of the workpiece stage 3 and/or the reticle stage 6 can be removed from the positional deviations (Ex, Ey) of the respective pairs of patterns, and hence are not contained in the residuals (dx, dy) calculated.

Next, in step S43, obtain corrected deviations (dx1, dy1) of the respective pairs of patterns formed in the stepping and exposing process of the reticle stage S21 by subtracting the translational errors (Tx, Ty) and rotational errors (Rx, Ry). In other words, the corrected deviations (dx1, dy1) of each exposure field are obtained by calculating the residuals (dx, dy) of the respective pairs of patterns of the same exposure field using the above Equation 1 and a fitting algorithm. As step S43 corresponds to sub-stage S21 which is, as discussed above, the stepping and exposing process of the reticle stage, step S43 is able to subtract the errors of the projection objective caused by the distance D between the portions 101 and 102 of each mark 1. Therefore, what is mainly contained in the corrected deviations (dx1, dy1) obtained after step S43 is the manufacturing tolerance error of the reticle 5.

Then, in step S44, obtain corrected deviations (dx2, dy2) of the respective pairs of patterns formed in the stepping and exposing process of the workpiece stage S22 by subtracting the translational errors (Tx, Ty) and rotational errors (Rx, Ry). In other words, the corrected deviations (dx2, dy2) of each exposure field are obtained by calculating the residuals (dx, dy) of the respective pairs of patterns of the same exposure field using the above Equation 1 and a fitting algorithm. Step S44 corresponds to sub-stage S22 which is, as discussed above, the stepping and exposing process of the workpiece stage. As each mark 1 itself has a certain size in both the X and Y directions, the two exposure positions of the same mark 1 in a corresponding exposure field will appear to be different imaging positions in the projection objective 7, and thus the distortion of the projection objective 7 will be incorporated in the corresponding corrected deviations (dx2, dy2) as exposure position deviations.

Then, in step S45, values ($\Delta x$, $\Delta y$) representing the distortion of the projection objective 7 are calculated from the corrected deviations (dx1, dy1) and (dx2, dy2) according to the following Equation 2:

$\Delta x = dx_2 - dx_1$ $\Delta y = dy_2 - dy_1$ (Equation 2)

By subtraction, the manufacturing tolerance error of the reticle is offset, thereby enabling the values ($\Delta x$, $\Delta y$) to exactly represent the overall objective distortion without being affect by the manufacturing tolerance error of the reticle.

Finally, in step S46, the distortions of the projection objective are calculated by using a fitting algorithm based on the values ($\Delta x$, $\Delta y$) obtained in step S45 and the following Equation 3:

$$\Delta x = Tx + Mx \cdot x - Rx \cdot y + Txy \cdot x \cdot y + D2x \cdot x^2 + (D2x - Tyx) \cdot y^2 + D3 \cdot x \cdot r^2 D4x \cdot x^2 \cdot r^2 + D4y \cdot x \cdot y \cdot r^2 + D5 \cdot x \cdot r^4$$

$$\Delta y = Ty + My \cdot y + Ry \cdot x + Tyx \cdot y \cdot x + D2y \cdot y^2 + (D2y - Txy) \cdot x^2 + D3 \cdot y \cdot r^2 + D4x \cdot x \cdot y \cdot r^2 + D4y \cdot y^2 \cdot r^2 + D5 \cdot y \cdot r^4$$

$$x \in [-Xslit/2, Xslit/2], y \in [-Yslit/2, Yslit/2] \quad \text{(Equation 3)}$$

In Equation 3, (x, y) represents a nominal coordinate of an imaging position of the mark in a coordinate system of the FOV and exists $r^2 = x^2 + y^2$; Xslit and Yslit are sizes of the FOV in the X and Y directions, respectively; Tx and Ty represent residuals of the translational error of the workpiece stage and/or reticle stage obtained after fitting using Equation 2 (it is noted that these residuals are factors obtained by fitting according to Equation 3 rather than known variables to be substituted in Equation 3, and that as the residuals are both very close to zero, it is applicable to directly substitute the condition Tx=Ty=0 in Equation 3 to simplify the equation); Rx and Ry represent residuals of the rotational error of the workpiece stage and/or reticle stage obtained after fitting using Equation 2 (similarly, it is noted that these residuals are also factors obtained by fitting according to Equation 3 rather than known variables to be substituted in Equation 3, and that as the residuals are both very close to zero, it is applicable to directly substitute the condition Rx=Ry=0 in Equation 3 to simplify the equation); Mx is a magnification error of the projection objective; Txy, Tyx, D2x and D2y are second-order distortions of the projection objective; D3 is a third-order distortion of the projection objective; D4x and D4y are fourth-order distortions of the projection objective; and D5 is a fifth-order distortion of the projection objective. While the measurable highest-order distortion according to Equation 3 is the fifth-order distortion, any other proper distortion fitting equation known in the art may be employed to meet the requirement for calculating distortion error of a different order.

It is noted that while with the assumption that the distortion of the projection objective is much greater than the randomly distributed motional errors of the workpiece stage and/or reticle stage, it is theoretically applicable to conduct distortion calculation by sampling only one set of positional deviation data corresponding to a single exposure field both in sub-stages S21 and S22. In practice, it is generally recommended to sample at least nine sets of data corresponding to nine individual exposure fields, or even sample a maximum number of sets of data until the silicon wafer is fully exposed. Moreover, it is also applicable to first calculate values of the individual distortion errors from the at least nine sets of data and then determine their ultimate values by individually averaging the calculated values, or alternatively, to first average the at least nine sets of data and then determine ultimate values of the distortion based on the average.

The preferred embodiments disclosed above are solely for describing the present invention and are not intended to limit the invention in any way. All alternative embodiments obtained by those skilled in the art through logical analysis, inference or limited experimentation based on the principles of the present invention are considered to be within the scope of the invention.

What is claimed is:

1. A method for measuring distortion of a projection objective, comprising:
    disposing a reticle on a reticle stage and disposing a substrate on a workpiece stage, the reticle having a plurality of marks formed thereon;
    performing a stepping and exposing process of the reticle stage, including:
        moving the substrate into an exposure field of the projection objective;
        performing a first exposure process to form on the substrate a plurality of first patterns of the plurality of marks corresponding to the current exposure field;
        keeping the workpiece stage unmoved and stepping the reticle stage by a first distance, and then performing a second exposure process to form on the substrate a plurality of second patterns of the plurality of marks corresponding to the current exposure field;
        obtaining a plurality of first positional deviations each between one of the plurality of first patterns and a corresponding one of the plurality of second patterns;
    performing a stepping and exposing process of the workpiece stage, including:
        moving the substrate into an exposure field of the projection objective;
        performing a first exposure process to form on the substrate a plurality of third patterns of the plurality of marks corresponding to the current exposure field;
        keeping the reticle stage unmoved and stepping the workpiece stage by a second distance, and then performing a second exposure process to form on the substrate a plurality of fourth patterns of the plurality of marks corresponding to the current exposure field;
        obtaining a plurality of second positional deviations each between one of the plurality of third patterns and a corresponding one of the plurality of fourth patterns;
    subtracting a motional error of the reticle stage and/or the workpiece stage from each first positional deviation to obtain a plurality of first corrected deviations, and subtracting a motional error of the reticle stage and/or the workpiece stage from each second positional deviation to obtain a plurality of second corrected deviations; and
    calculating a plurality of differences each between one of the plurality of second corrected deviations and a corresponding one of the plurality of first corrected deviations, and calculating a distortion of the projection objective based on the plurality of differences.

2. The method according to claim 1, wherein the substrate is disposed on the workpiece stage at a position aligned with a center of the projection objective.

3. The method according to claim 1, wherein the stepping and exposing process of the reticle stage is performed prior to the stepping and exposing process of the workpiece stage, or the stepping and exposing process of the workpiece stage is performed prior to the stepping and exposing process of the reticle stage.

4. The method according to claim 1, wherein:
    performing the stepping and exposing process of the reticle stage further includes optimizing an exposure path prior to moving the substrate into an exposure field of the projection objective; and performing the stepping and exposing process of the workpiece stage further includes optimizing an exposure path prior to moving the substrate into an exposure field of the projection objective.

5. The method according to claim 1, wherein each of the plurality of marks comprises two portions arranged in parallel to each other.

6. The method according to claim 5, wherein each of the plurality of marks is an overlay mark.

7. The method according to claim 5, wherein the reticle stage is stepped by a first distance in a direction along a line connecting centers of the two portions of any of the plurality of marks, and wherein the workpiece stage is stepped by a second distance in a direction along a line connecting centers of the two portions of any of the plurality of marks.

8. The method according to claim 7, wherein the first distance is D*Nom_mag, where D is a distance between the centers of the two portions of each of the plurality of marks, and Nom_mag is a nominal magnification of the projection objective.

9. The method according to claim 7, wherein the second distance is D, where D is a distance between the centers of the two portions of each of the plurality of marks.

10. The method according to claim 1, wherein the motional error of the reticle stage and/or the workpiece stage includes a translational error and a rotational error of the reticle stage and/or the workpiece stage.

11. A method for measuring distortion of a projection objective, comprising:
   disposing a reticle on a reticle stage and disposing a substrate on a workpiece stage, the reticle having a plurality of marks formed thereon;
   performing a stepping and exposing process of the reticle stage, including:
      a1) moving the substrate into an exposure field of the projection objective;
      a2) performing a first exposure process to form on the substrate a plurality of first patterns of the plurality of marks corresponding to the current exposure field;
      a3) keeping the workpiece stage unmoved and stepping the reticle stage by a first distance, and then performing a second exposure process to form on the substrate a plurality of second patterns of the plurality of marks corresponding to the current exposure field;
      a4) obtaining a set of first positional deviations each between one of the plurality of first patterns and a corresponding one of the plurality of second patterns;
      a5) moving the substrate into a next exposure field of the projection objective;
      a6) repeating steps a2 to a5 to obtain a plurality of sets of first positional deviations corresponding to a plurality of exposure fields;
   performing a stepping and exposing process of the workpiece stage, including:
      b1) moving the substrate into an exposure field of the projection objective;
      b2) performing a first exposure process to form on the substrate a plurality of third patterns of the plurality of marks corresponding to the current exposure field;
      b3) keeping the reticle stage unmoved and stepping the workpiece stage by a second distance, and then performing a second exposure process to form on the substrate a plurality of fourth patterns of the plurality of marks corresponding to the current exposure field;
      b4) obtaining a set of second positional deviations each between one of the plurality of third patterns and a corresponding one of the fourth patterns;
      b5) moving the substrate into a next exposure field of the projection objective;
      b6) repeating steps b2 to b5 to obtain a plurality of sets of second positional deviations corresponding to a plurality of exposure fields;
   subtracting a motional error of the reticle stage and/or the workpiece stage from each of the plurality of sets of first positional deviations to obtain a plurality of sets of first corrected deviations, and subtracting a motional error of the reticle stage and/or the workpiece stage from each of the plurality of sets of second positional deviations to obtain a plurality of sets of second corrected deviations; and
   calculating a plurality of sets of differences each between one of the plurality of sets of first corrected deviations and a corresponding one of the plurality of sets of second corrected deviations of a same exposure field, and calculating a distortion of the projection objective based on the plurality of sets of differences.

12. The method according to claim 11, wherein the substrate is disposed on the workpiece stage at a position aligned with a center of the projection objective.

13. The method according to claim 11, wherein the stepping and exposing process of the reticle stage is performed prior to the stepping and exposing process of the workpiece stage, or the stepping and exposing process of the workpiece stage is performed prior to the stepping and exposing process of the reticle stage.

14. The method according to claim 11, wherein:
   performing the stepping and exposing process of the reticle stage further includes optimizing an exposure path prior to step a1; and
   performing the stepping and exposing process of the workpiece stage further includes optimizing an exposure path prior to step b1.

15. The method according to claim 11, wherein each of the plurality of marks comprises two portions arranged in parallel to each other.

16. The method according to claim 15, wherein each of the plurality of marks is an overlay mark.

17. The method according to claim 15, wherein the reticle stage is stepped by a first distance in a direction along a line connecting centers of the two portions of any of the plurality of marks in step a3, and wherein the workpiece stage is stepped by a second distance in a direction along a line connecting centers of the two portions of any of the plurality of marks in step b3.

18. The method according to claim 17, wherein the first distance is D*Nom_mag, where D is a distance between the centers of the two portions of each of the plurality of marks, and Nom_mag is a nominal magnification of the projection objective.

19. The method according to claim 17, wherein the second distance is D, where D is a distance between the centers of the two portions of each of the plurality of marks.

20. The method according to claim 11, wherein the motional error of the reticle stage and/or the workpiece stage includes a translational error and a rotational error of the reticle stage and/or the workpiece stage.

* * * * *